United States Patent [19]

Kang et al.

[11] Patent Number: 4,591,522

[45] Date of Patent: May 27, 1986

[54] LIQUID PHOTOPOLYMERS CURABLE TO FIRE-RETARDANT, HYDROLYSIS RESISTANT COMPOSITIONS

[75] Inventors: Uan G. Kang; Richard W. Bush, both of Columbia; Arthur D. Ketley, Chevy Chase; Clifford A. Ferrin, Jr., Baltimore, all of Md.

[73] Assignee: W. R. Grace & Co., New York, N.Y.

[21] Appl. No.: 688,856

[22] Filed: Jan. 4, 1985

[51] Int. Cl.$^4$ ............................................. B05D 3/06
[52] U.S. Cl. ..................... 428/419; 252/601; 427/44; 427/54.1; 522/107; 522/168
[58] Field of Search ............ 427/44, 54.1; 428/419; 204/159.22; 252/601

[56] References Cited

U.S. PATENT DOCUMENTS

| | | |
|---|---|---|
| 2,462,601 | 2/1949 | Bohrer . |
| 2,617,820 | 11/1952 | Gamrath . |
| 2,810,712 | 10/1957 | Baranauckas . |
| 2,898,331 | 8/1959 | Dorinson . |
| 3,086,985 | 4/1963 | Stange . |
| 3,258,495 | 6/1966 | LeFave . |
| 3,278,496 | 10/1966 | LeFave . |
| 3,551,246 | 12/1970 | Bassemir . |
| 3,661,744 | 5/1972 | Kehr . |
| 3,676,440 | 7/1972 | Los . |
| 4,008,341 | 2/1977 | Kehr . |
| 4,020,233 | 4/1977 | Morgan . |
| 4,105,710 | 8/1978 | Thomas . |
| 4,201,842 | 5/1980 | Lombardi . |
| 4,443,495 | 4/1984 | Morgan et al. ............ 427/96 |

FOREIGN PATENT DOCUMENTS

| | | |
|---|---|---|
| 0017364 | 3/1980 | European Pat. Off. . |
| 1372967 | 10/1963 | France . |
| 48-92351 | 10/1973 | Japan . |

*Primary Examiner*—John H. Newsome
*Attorney, Agent, or Firm*—Richard P. Plunkett; William W. McDowell, Jr.

[57] ABSTRACT

Novel fire-retardant and hydrolysis resistant, liquid, photosensitive compositions are disclosed comprising
  (1) the reaction product of
    (a) an aliphatic unsaturation containing chlorendate, and
    (b) a non-ester containing polythiol, said (a) and (b) being reacted non-stoichiometrically;
  (2) a member of the group consisting of either (a) or (b) in an amount up to that sufficient to react with the excess of the other in (1) and a liquid acrylate monomer or oligomer, and
  (3) at least one photoinitiator.

Acrylates or methacrylate monomers are optionally added to the composition.

13 Claims, No Drawings

LIQUID PHOTOPOLYMERS CURABLE TO FIRE-RETARDANT, HYDROLYSIS RESISTANT COMPOSITIONS

BRIEF DESCRIPTION OF THE INVENTION

In the screen printable coatings for electronic circuitry technology a need exists to devise formulations which render said coatings fire-retardant and hydrolysis-resistant which also, for ease of applicability, are liquid at ambient conditions prior to cure.

The novel formulations of the present invention fulfill the above requirements in that coatings for electronic circuitry are provided which screen-print well, photocuring fast into hydrolysis-resistant and solder-resistant materials.

The formulations of the present invention comprise a prepolymer of a polyene which consists of halogenated allyl and/or methallyl esters in chemical combination with a polythiol, and additional polyenes, additional polythiols, (meth)acrylates, photoinitiators and fillers.

More specifically, the formulations disclosed in the present invention comprise allyl and/or methallyl chlorendates reacted non-stoichiometrically with a non-ester containing thiol, i.e., tris-mercaptoethyl isocyanurate or a thiol terminated polyoxyalkylene polyol, admixed with photoinitiator and one or more of the following: additional polyene, additional polythiol, methacrylate monomer and, optionally, in the presence of fire-retardant fillers, an adhesion promoter, stabilizers, viscosity modifiers and dyes.

DETAILED DESCRIPTION OF THE INVENTION

In response to the need for developing compositions suited for application as coatings for electronic circuitry with incorporate two basic properties, namely (a) that they be radiation curable and (b) that they be fire-retardant, research programs have been devised which, interalia, have focussed on halogenated allylic and/or methallylic esters since these compounds meet these two basic requirements. Thus, reference may be made to patent art documenting such compositions by citing, for example, U.S. Pat. No. 4,105,710 which teaches imparting flame-retardant properties to curable vinyl unsaturated polymers by incorporation therein of halogenated allyl esters. For art documenting the preparation of halogenated allyl esters, one may refer to U.S. Pat. Nos. 2,462,601, 2,617,820 and 3,086,985. Prior art references to photopolymers which encompass some of the features of this invention include U.S. Pat. No. 4,020,233 which discloses use of benzopinacol to prereact a polymer with a substoichiometric amount of polythiol; U.S. Pat. No. 3,661,744 which discloses allyl compounds cured with thiols; U.S. Pat. No. 4,008,341 which discloses acrylates cured with thiols; U.S. Pat. No. 3,551,246, U.S. Pat. No. 4,201,842 and European patent application No. 17,364 which disclose allyl compounds cocured with acrylates; U.S. Pat. No. 4,216,267 which discloses a flexible substrate with an acrylate-based radiation-curable coating, but the coating is not fire retardant.

It is an object of the present invention to provide photosensitive compositions which besides being fire-retardant are hydrolysis-resistant and in the uncured state remain liquid at ambient conditions.

It is a further object of the present invention to provide such liquid-at-ambient-temperature, photosensitive compositions which can be formulated with a photoinitiator and with fillers to result in screenable liquids which can be applied to electronic circuit boards and can be cured with UV light to hard coatings.

These and other objects of the present invention will become more evident as the description of the invention proceeds.

This invention is based on the use of the class of unsaturated diesters of polyhalogen containing unsaturated dicarboxylic acid esters known as chlorendates. From U.S. Pat. No. 2,810,712 it is known to prepare the diallyl 1,4,5,6,7,7-hexachlorobicyclo-(2.2.1)-5-heptene-2,3-dicarboxylate, i.e., diallyl chlorendate by the esterification of 1,4,5,6,7,7-hexachlorobicyclo-(2.2.1)-heptene-2.3-dicarboxylic acid or acid anhydride with allyl alcohol. Additionally, reference may be made to U.S. Pat. No. 2,898,331 wherein aliphatic unsaturation containing diesters of chlorendic acid are prepared as well via the anhydride corresponding unsaturated alcohol reaction route.

In the present invention a synthesis route for such chlorendates is described which may be used to produce either diallyl chlorendate, hereinafter referred to as DAC, dimethallyl chlorendate, hereinafter referred to as DMAC, or allyl-methallyl chlorendate, hereinafter referred to as AMAC.

The preparation of DAC is accomplished via the conversion of chlorendic anhydride to its salt in a basic medium followed by reaction with allyl chloride in the presence of copper/cuprous catalyst. The equation of this reaction is shown as follows:

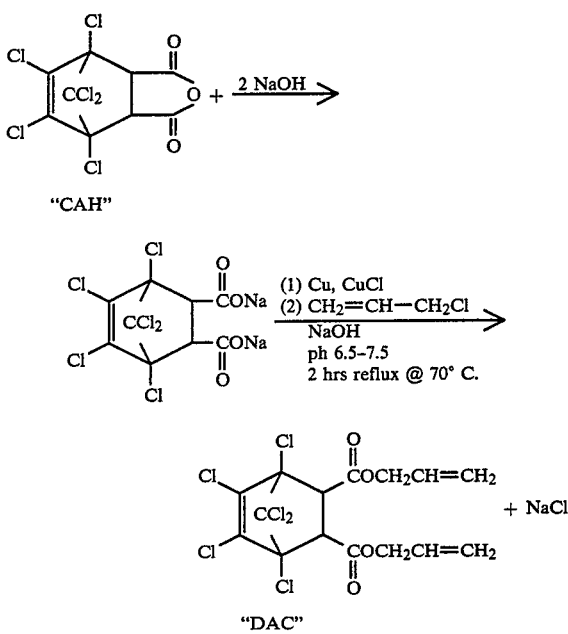

When, instead of allyl chloride, methallyl chloride is used as the unsaturation containing reactant, DMAC will result as the product and, similarly, when an equimolar mixture of allyl chloride and methallyl chloride is used as the unsaturation containing reactant mixture, the main product will be AMAC.

Thus, compounds covered by the present disclosure have in effect the following structure:

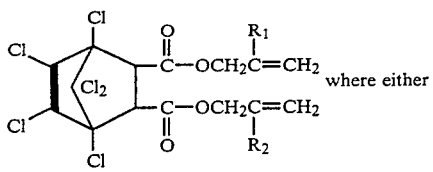

(1) $R_1 = R_2 = H$ or
(2) $R_1 = H$; $R_2 = CH_3$ or
(3) $R_1 = R_2 = CH_3$

While Compound 1 (DAC) and Compound 3 (DMAC) are known (Japanese Kokai No. 73/92,351, Nov. 30, 1973, discloses the synthesis of DAC and DMAC from chlorendic acid or its anhydride with allyl halides or methallyl halides in the presence of Cu or Cu compounds), Compound 2 (AMAC) is believed to be novel.

The Cu/CuCl catalyst used in this reaction is one which is used to synthesize allyl esters from non-halogenated anhydrides and is disclosed in French Pat. No. 1,372,967, Sept. 18, 1964.

The above chlorendates are thereby produced in high yield.

It was discovered that, when the afore-mentioned chlorendates were reacted non-stoichiometrically with non-ester containing thiols and subsequently formulated with additional chlorendates, additional thiols, methacrylates, photoinitiators and other additives, the product would be a liquid-at-ambient-temperature photosensitive polymer, ideally suited for application as electronic circuit board coating in that it was screen printable and would cure to a fire-retardant, hydrolysis-resistant coating.

Thus, a photocurable, liquid-at-ambient temperature, hydrolysis resistant and flame retardant composition comprising (1) the reaction product of
  (a) an aliphatic unsaturation containing chlorendate, and
  (b) a non-ester containing polythiol, said (a) and (b) being reacted non-stoichiometrically;
(2) a member of the group consisting of either (a) or (b) in an amount sufficient to react with the excess of the other in (1) and a liquid acrylate monomer or oligomer, and
(3) at least one photoinitiator, is one result of this invention.

It was first discovered that non-ester containing thiols in general and particularly tris-mercaptoethyl isocyanurate described in U.S. Pat. No. 3,676,440, and hereinafter referred to as TMEIC, were well suited for the reaction with the aforementioned chlorendates. This compound has the following chemical structure:

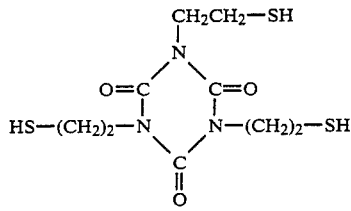

Although TMEIC is suitable for the present invention's application, it is not ordinarily commercially available.

It was subsequently discovered that, when another non-ester trithiol, a mercaptan-terminated polyoxyalkylene triol which is commercially known as Capcure 3-800, and hereinafter is referred to as such, was reacted non-stoichiometrically with the aforementioned chlorendates and admixed with an acrylate, plus photoinitiators and other additives, the resulting liquid-at-ambient-temperature photosensitive polymer was also suitable for electronic circuit board coating applications.

Capcure 3-800 has the following chemical structure:

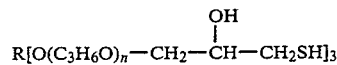

where R = aliphatic hydrocarbon and n = 1–2.

Polythiols of similar structure but having thiol functionality greater than 3 are also operable, e.g., Capcure 5-1300 of the following structure:

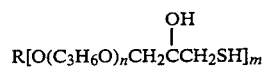

where R = aliphatic hydrocarbon, N = 1–2 and m = 5–6.

Mercaptan-terminated liquid polymers of this type have been prepared from reaction of polyoxyalkylene polyols with epichlorohydrin and subsequently with a sulfur-containing reactant, and prior art references documenting this synthesis are found in the G. M. LeFave U.S. Pat. Nos. 3,278,496 and 3,258,495.

Use of the commercially available Capcure 3-800 resulted in the discovery as previously mentioned that it would react with the invention's chlorendates and, if used with acrylates and/or methacrylates, result in a product which was liquid-at-ambient-temperature, photosensitive, fire-retardant and hydrolytically stable when cured; a product ideally suited as a coating for electronic circuit boards since it combines furthermore the properties of rapid UV curing, screen printability, adhesion and flexibility.

Hydrolytically unstable samples for comparison testing were prepared using the invention's allylic chlorendates with an ester-containing thiol, i.e., using pentaerythritol tetrakis(3-mercaptopropionate), and which can be represented by the following chemical structure:

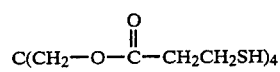

In practicing the instant invention, since some of the chlorendates and some of the non-ester containing thiols can solidify at room temperature thereby precluding screen printability, it is critical that the chlorendate and polythiol be reacted together in non-stoichiometric amounts in order to prevent crystallization and to obtain a liquid prepolymer. Thus, 5 to 95%, preferably 10–50%, of the functional groups of either the chlorendate or polythiol is reacted with the other in order to obtain a liquid mixture of the thus formed prepolymer and either excess chlorendate or polythiol. Addition of liquid acrylate monomer or acrylate oligomer also helps to maintain the mixture in the liquid phase.

The first step in the manufacture of the products according to the teachings of the present invention lies in the reaction of one or a mixture of these aliphatic unsaturation containing chlorendates in non-stoichiometric amounts with Capcure 3-800 or with TMEIC or with Capcure 3-800/TMEIC mixtures, optionally, in the presence of a thermally initiated free-radical generator, preferably benzopinacol. U.S. Pat. No. 4,020,233 discloses use of catalytic amounts of substituted or unsubstituted pinacol to prereact a polyene with a substoichiometric amount of a polythiol.

The substituted or unsubstituted pinacols operable herein as a thermal initiator have the general formula:

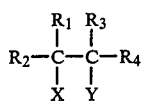

wherein $R_1$ and $R_3$ are the same or different substituted or unsubstituted aromatic radicals, $R_2$ and $R_4$ are substituted or unsubstituted aliphatic or aromatic radicals and X and Y, which may be the same or different, are hydroxyl, alkoxy or aryloxy.

The pinacol, if used, is added to the composition in amounts ranging from 0.01 to 5%, preferably 0.1 to 3% by weight based on the weight of the allylically unsaturated compound and the polythiol.

The prepolymer consisting of non-stoichiometric chlorendate/TMEIC or chlorendate/Capcure 3-800 is then formulated with additional chlorendates, additional polythiol, acrylate, photoinitiators, and other additives to give the final product.

One class of photoinitiators are the aldehyde and ketone carbonyl compounds having at least one aromatic nucleus attached directly to the carbonyl group. These photoinitiators include, but are not limited to, benzophenone, acetophenone, o-methoxybenzophenone, acenapthene-quinone, methyl ethyl ketone, valerophenone, hexanophenone, alpha-phenylbutyrophenone, p-morpholino-propionphenone, dibenzosuberone, 4-morpholino-benzophenone, 4'-morpholinodeoxybenzoin, p-diacetyl-benzene, 4-aminobenzophenone, 4-methoxyacetophenone, benzaldehyde, alpha-tetralone, 9-acetylphenanthrene, 2-acetylphenanthrene, 10-thioxanthenone, 3-acetyl-phenanthrene, 3-acetylindole, 9-fluorenone, 1-indanone, 1,3,5-triacetylbenzene, thioxanthen-9-one, xanthene-9-one, 7-H-benz[de]anthracen-7-one, 1-napthaldehyde, 4,4'-bis(dimethylamino) benzophenone, fluorene-9-one, 1'-acetonaphthone, 2'-acetonaphthone, 2,3-butanedione, triphenylphosphine, tri-o-tolylphosphine, acetonaphthone, 2,3-butanedione, benz[a]anthracene-7,12-dione, etc. Another class of photoinitiators is the benzoin ethers, such as benzoin methyl ether, benzoin ethyl ether, benzoin isopropyl ether and benzoin isobutyl ether. Another class of photoinitiators is the ketals, exemplified by 2,2-dimethoxy-2-phenylacetophenone. The photoinitiators are usually added in an amount ranging from 0.0005 to 30% by weight of the combined allylically unsaturated compound and the polythiol and the acrylate monomer.

For UV radiation, an intensity of 0.0004 to 60.0 watts/cm$^2$ in the 250–400 nanometer region is usually employed.

One or more liquid acrylate or methacrylate monomers or oligomers can optionally be added to the formulation to decrease the viscosity of the uncured formulation or to improve the mechanical strength of the cured coating. Such monomers or oligomers may be mono- or polyfunctional.

An acrylate compound which was determined to produce satisfactory results, when formulated with the allylic chlorendates and with the mercaptan-terminated polyoxyalkylene triol, was ethoxylated bisphenol-A dimethacrylate, i.e., EOBADMA, which can be represented by the following chemical structure:

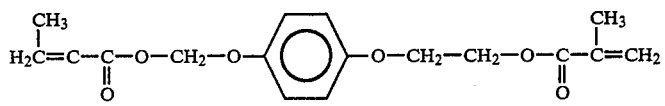

Other examples include, but are not limited to, tetraethylene glycol dimethacrylate (TEGDMA), diethylene glycol dimethacrylate, pentaerythritol tetraacrylate, isodecyl methacrylate, isobornyl methacrylate, tris-hydroxyethyl isocyanurate triacrylate. Additional fire retardance can be achieved by using a liquid halogenated acrylate or methacrylate, e.g., bis-(3-methacryloxy-2-hydroxypropyl)chlorendate or bis-(3-methacryloxy-2-hydroxypropyl)tetrabromophthalate.

The additional polyene, if used, is generally the same allylic chlorendate as used in the initial reaction step. It can, however, be an alternative halogenated material, for example, bis-(3-allyloxy-2-hydroxypropyl)tetrabromophthalate, or a mixture thereof with the allyl chlorendate.

The additional polythiol, if used, is generally one of the two non-ester polythiols aforementioned: tris-mercaptoethyl isocyanurate or the mercaptan-terminated polyoxyalkylene triol.

As mentioned previously, the desired characteristics of the product are that (a) it be liquid at ambient conditions in the uncured state, (b) it be hydrolysis-resistant after cure and (c) it be fire-retardant after cure. The chief means of achieving liquidity in this invention is based upon (1) pre-reaction of the solid polythiol TMEIC with a substoichiometric amount of DAC, DMAC, AMAC or mixtures thereof or (2) pre-reaction of the solid polyene DAC with a substoichiometric amount of Capcure 3-800. This pre-reaction decreases the crystallity of the solid component and assists in keeping it liquid when formulated. The optional addition of a liquid acrylate or methacrylate in the formulation further provides for its liquidity. Hydrolysis resistance is provided by use of non-ester polythiols. Fire retardance is provided primarily by the halogenated polyene DAC, DMAC, AMAC and mixtures thereof. Additional fire retardance is provided by the addition of other halogenated monomers or inert fillers to the formulation.

In contrast to the bove chlorendate-based recipes, combinations of non-halogenated polyenes with ester-containing thiols, while being photocurable and liquid-at-ambient-temperature, are neither hydrolysis-resistant nor fire-retardant. On the other hand, DAC, in combination with typical ester containing thiols, while liquid at ambient conditions and while exhibiting fire retardancy properties, does not turn out to be hydrolysis-resistant.

Particularly, advantageous results are obtainable in the present invention by using the invention's chlorendate with Capcure 3-800 and a methacrylate compound and, additionally, including organic and inorganic fire-retardant fillers, particularly an aliphatic, halogenated hydrocarbon filler available as "Dechlorane Plus" is added to further improve fire-retardant properties and an adhesion promoting filler sold commercially as Micro Talc. Furthermore, other additives may be incorporated in the photosensitive composition of this invention as will be illustrated as the present invention is further described by means of the following examples which, while incorporated to additionally substantiate the claims of the invention, are in no way intended to limit the scope thereof.

EXAMPLE 1

Synthesis of Allyl Methallyl Chlorendate (AMAC)

A mixture of 185.5 g chlorendic anhydride, 310 ml 11.1% sodium hydroxide solution, 0.2 g Cu powder and 1.0 g CuCl and a mixture of 77 g allyl chloride and 91 g methallylic chloride was stirred 2 hours at 70° C. to give a 227 g (94%) chlorendate ester product. The pH was kept between 6.5 and 7.5 by adding a sodium hydroxide solution during the reaction.

The product mixture contained 15% DAC, 55% AMAC and 30% DMAC.

EXAMPLE 2

Diallyl chlorendate (DAC) was synthesized in a similar manner by using allyl chloride in place of the mixture of allyl chloride and methallyl chloride.

EXAMPLE 3

Dimethallyl chlorendate (DMAC) was synthesized in a similar manner by using methallyl chloride in place of allyl chloride.

EXAMPLE 4

A mixture of 625 g TMEIC (SH=9.05 meq/g), 350 g AMAC mixture from Example 1 (C=C 4.04 mmoles/g) and 0.96 g benzopinacol was heated for 60 minutes at 90° C. At 60° C. 1,050 g AMAC, 72 g of 2,2-dimethoxy-2-phenylacetophenone, 31 g of benzophenone, 400 g of "Hydral" alumina and 45 g of pyrogenic silica were added and mixed.

This formulation screen-prints well, photocures fast, is hydrolysis-resistant and has solder resistance. A 10 mil thick film has Oxygen Index of 29.

EXAMPLE 5

AMAC/TMEIC/Capcure 3-800 Formulation

A mixture of 404.56 g TMEIC (SH=8.24), 243.75 g AMAC mixture from Example 1 (C=C 4.04 mmole/g) and 1.43 g benzopinacol was heated for 60 minutes at 90° C. At 60° C., 731.25 g of AMAC mixture, 166.53 g of Capcure 3-800, 1.43 g $H_3PO_3$, 2.86 g pyrogallol, 22.10 g benzophenone, 51.74 g 2,2-dimethyl-2-phenylacetophenone (Irgacure 651), 390.0 g of "Dechlorane Plus 2520", 32.50 g pyrogenic silica (Aerosil), 3.25 g ethylene glycol, 7.15 g of an antifoaming agent (Nalco-2301) and 1.56 g of a phthalocyanine blue pigment (C.I. Pigment Blue 16), sold by Ciba-Geigy as Irgazin-Blue, were added and mixed.

This formulation screen-prints well, photocures fast, is very flexible, is hydrolysis-resistant and has solder resistance. A ten-mil thick film has Oxygen Index of 28.

EXAMPLE 6

DAC/TMEIC Formulation

A mixture of 39.87 g TMEIC (SH=8.24 meq/g), 18.75 g DAC (C=C 4.38 mmoles/g) and 0.13 g benzopinacol was heated for 45 minutes at 90° C. At 60° C., 56.25 g DAC, 0.22 g pyrogallol, 0.11 g $H_3PO_3$, 1.70 benzophenone, 3.98 g Irgacure 651, 22.15 g Hydral alumina, 2.5 g Aerosil 200, 0.34 g ethylene glycol, 3.63 g isodecyl methacrylate and 0.57 g Nalco 2301 were added and mixed. This formulation screen prints well, photocures fast, is hydrolysis resistant and has solder resistance. A ten mil thick film has Oxygen Index of 29.

EXAMPLE 7

DAC/TMEIC/Capcure 3-800 Formulation

A mixture of 31.12 g TMEIC (SH=8.24 meq/g), 18.75 g DAC (C=C 4.38 mmoles/g) and 0.11 g benzopinacol was heated for 90 minutes at 90° C. At 60° C., 19.90 g Capcure 3-800 (SH=3.62 meq/g), 56.25 g DAC, 3.98 g Irgacure-651, 0.22 g pyrogallol, 0.11 g $H_3PO_3$, 1.70 g benzophenone, 25.0 g "Dechlorane Plus 25", 5 g Hydral alumina, 2.5 g Aerosil-200, 0.25 g ethylene glycol, 0.55 g Nalco-2301, 3.0 g isodecyl methacrylate and 0.14 g Irgazin Blue were added and mixed. This fire-retardant formulation screen-prints well, photocures fast, is hydrolysis resistant and has solder resistance.

EXAMPLE 8

DAC/Capcure 3-800/Dimethacrylate Formulation

The first step is partial prepolymerization of the DAC with a substoichiometric amount of Capcure 3-800 polythiol to prevent the DAC from crystallizing out during storage of the formulation. In this example benzopinacol was omitted from the prepolymerization without deleterious effects on the final product.

DAC and Capcure 3-800 were preheated at 90° C. in separate resin kettles. Then 481.0 g of preheated Capcure 3-800 (3.62 meq SH/g) was poured into 2,019.5 g DAC (4.38 meq C=C/g) in a 4-liter resin kettle at 90° C. The mixture was stirred for 15 minutes at 90° C. and cooled rapidly with a cold tap water bath to room temperature with stirring for homogeneous cooling. The prepolymer viscosity was between 4,000–8,000 cps at 22° C. with Brookfield RVT Spindle #7 at 100 rpm.

At room temperature, the following ingredients were then added to 559.16 g of the prepolymer while mixing vigorously: 0.55 g pyrogallol, 0.15 g phosphorous acid, 30.71 g 2,2-dimethoxy-2-phenyl-acetophenone, sold commercially under the tradename "Irgacure 651", 13.07 g benzophenone, 2.29 g of a flow modifier sold commercially under the name "Modaflow", 2.29 g of a thixotropic agent known as Lithene-PL, 133.0 g ethoxylated bisphenol-A dimethacrylate, 5.80 g phthalo green and 0.14 g phthalocyanine blue pigment sold by Ciba-Geigy as Irgazin-Blue. These components were mixed for 2 hours until the mixture was homogeneous and the solids had dissolved. Next, the following materials were incorporated into the above mixture while stirring vigorously for 2 hours to insure even distribution: 263.85 g of a chlorinated alicyclic hydrocarbon, $C_{18}H_{12}Cl_{12}$, commercially available as "Dechlorane Plus 2520" to impart further fire retardant properties to said mixture, 85.08 g ground calcium carbonate filler available commercially as Vicron 15-15, 52.31 g adhesion promoting filler sold under the name of "Micro Talc", 3.35 g of antimony trioxide available as Fire Shield AO-L, 22.75 g of dispersant commercially available as Polymist F5A and, to impart thixotropic properties, 1.74 g ethylene glycol and 15.7 g precipitated silica sold as Aerosil.

This formulation performed well as a hydrolysis resistant and fire-retardant covercoat and solder mask. It screen-printed well and rapidly UV cured to tough, flexible polymer. This coating had good adhesion to a circuit board. A ten-mil thick, free-standing film was fire-retardant and had Oxygen Index of 29. A one-mil thick coating passed a 1,000-hour hydrolysis resistant test on fine comb circuit board at 100° C. and 95 relative humidity.

Other acrylates and methacrylates were used with the DAC/Capcure prepolymer as reactive diluent instead of ethoxylated bisphenol-A dimethacrylate to make similar formulations that also gave satisfactory performance as fire retardant, hydrolysis resistant screenable coatings. These acrylates and methacrylates included:
tetraethylene glycol dimethacrylate: (Example 8a)
diethylene glycol dimethacrylate: (Example 8b)
tris-hydroxyethyl isocyanurate diacrylate plus isobornyl methacrylate: (Example 8c)
pentaerythritol tetracrylate plus isobornyl methacrylate: (Example 8d)
bis-(3-methacryloxy-2-hydroxypropyl)chlorendate: (Example 8e)
In another example a halogenated allyl compound (3-allyloxy-2-hydroxypropyl)chlorendate was added to the DAC/Capcure prepolymer as a reactive diluent. This formulation also gave satisfactory performance as a fire retardant, hydrolysis resistant screenable coating (Example 8f).

EXAMPLE 9

Use in a Flexible Film Substrate

A one-mil thick, cured coating of the formulation from Example 8 on five-mil thick Mylar was very flexible and passed a ⅛" mandrel bar test.

The formulation from Example 8 was also coated on at a 1.5 mil thickness on both sides of a Mylar sheet. It significantly improved fire-retardancy and dimensional stability in heat shock at 250° C. compared to the uncoated Mylar. This new flexible substrate has good tear strength, hydrolysis resistance and could be punctured to give clean holes See TABLE I:

TABLE I

| Property | New Substrate | Uncoated Mylar |
|---|---|---|
| Oxygen Index | 29 | 22 |
| Solder Dip Test (250° C. for 2 seconds) | Fair Slightly curled | Poor - shrinks extensively |

TABLE I-continued

| Property | New Substrate | Uncoated Mylar |
|---|---|---|
| Hydrolysis Resistance (70° C./1 M NaOH) | Passed 24 hours | Passed 24 hours |
| Clean Puncture | Fair | Fair |
| Flexibility (mandrel bar test) | 3/16" | ⅛" |
| Adhesion to Mylar (Cross Hatch Tape test) | Very good | — |
| Modulus, psi | 590,000 | — |
| Tensile, psi | 17,000 | 26,000–40,000* |
| Elongation @ failure % | 26 | 75* |

*Literature values (DuPont)

EXAMPLE 10

AMAC/Capcure 3-800/Dimethacrylate Formulation

Using AMAC mixture from Example 1 and the same procedure as in Example 8, coating formulations were prepared using EOBDMA or TEGDMA as diluent. These resulted in photocurable products of equally satisfactory performance.

The following Tables more clearly illustrate the optimum-result formulations used in the present invention and the advantageous properties thereof.

EXAMPLE 11

Hydrolytic Stability Tests

TABLE II demonstrates the superior hydrolysis resistant properties of the photocured composition of the present invention based on a non-ester containing thiol vis-a-vis one based on an ester-containing thiol. Therein Samples A, B and C represent the same DAC/Capcure 3-800/EOBDMA formulation of Example 8 with minor variations in other additives. The formulations are given in detail in TABLE III but basically are composed of diallyl chlorendate, mercaptan-terminated polyoxyalkylene triol and ethoxylated bisphenol-A dimethacrylate; i.e., DAC/Capcure 3-800/EOBADMA at 39.0 to 9.0 to 11.00 parts by weight proportions.

For comparison, Formulation D represents an ester containing thiol composition consisting basically of diallyl chlorendate and pentaerythritol tetrakis (3-mercaptopropionate), i.e., DAC/Q-43 at 52.0 to 28.0 parts-by-weight proportions.

The hydrolysis resistance testing results of TABLE II were obtained at a temperature of 100° C. and a relative humidity of 95% for times up to 1,066 hours by measuring the decrease in insulation resistance. The testing circuit boards used were "fine comb". A saturated solution of potassium sulfate was used to maintain the humidity.

Besides the good hydrolysis resistance results obtained with the present invention's coating formulations, their solderability was also very satisfactory. Said solderability was determined by dipping a coated and cured board into a solder tank at 265° C. for 5 seconds and observing for coating failure.

TABLE II

Hydrolysis Resistance Results
Insulation Resistance, $10^7$ ohm (100 volts), 100° C., 95% Relative Humidity

| Material | Hours |  |  |  |  |  |  |  |  |  |  |  |  |  |  |
|---|---|---|---|---|---|---|---|---|---|---|---|---|---|---|---|
|  | 24 | 48 | 120 | 216 | 312 | 360 | 480 | 552 | 634 | 730 | 802 | 897 | 970 | 1,018 | 1,066 |
| Uncoated Board | 3.23 | 2.33 | 2.30 | 1.93 | 2.01 | .47 | 1.89 | 1.78 | 2.02 | 1.85 | 1.96 | 1.96 | 1.80 | 1.93 | 2.14 |
| Sample A | 1.82 | 1.21 | .84 | .53 | .46 | .27 | .26 | .23 | .25 | .21 | .21 | .21 | .16 | .15 | .14 |
| Sample B | 1.77 | 1.81 | 1.10 | .70 | .75 | .57 | .55 | .49 | .46 | .39 | .35 | .26 | .19 | .21 | .26 |
| Sample C | .60 | .44 | .28 | .20 | .18 | .16 | .14 | .14 | .13 | .12 | .12 | .13 | .11 | .11 | .12 |

TABLE II-continued

| | Hydrolysis Resistance Results | | | | | | | | | | | | | |
|---|---|---|---|---|---|---|---|---|---|---|---|---|---|---|
| | Insulation Resistance, $10^7$ ohm (100 volts), 100° C., 95% Relative Humidity | | | | | | | | | | | | | |
| | Hours | | | | | | | | | | | | | |
| Material | 24 | .48 | 120 | 216 | 312 | 360 | 480 | 552 | 634 | 730 | 802 | 897 | 970 | 1,018 | 1,066 |
| Sample D | .52 | .33 | .07 | — | — | — | — | — | — | — | — | | | | |

TABLE III

Composition of Samples A, B, C (used in Table II)

| Materials | A % | B % | C % |
|---|---|---|---|
| DAC | 39.10 | 38.18 | 39.20 |
| Capcure 3-800 | 9.00 | 8.79 | 8.68 |
| Pyrogallol | .05 | .05 | .11 |
| $H_3PO_3$ | .01 | .01 | .07 |
| Irgacure-651 | 2.64 | 2.57 | 2.53 |
| Benzophenone | 1.12 | 1.10 | 1.07 |
| Modaflow | .20 | .19 | .19 |
| Lithene PL | .20 | .19 | .19 |
| EOBADMA | 11.33 | 11.11 | 10.71 |
| Dechlorane Plus 2520 | 22.12 | 22.13 | 21.80 |
| Vicron 15-15 ($CaCO_3$) | 7.13 | 7.13 | 7.03 |
| MP 12-50 (Microtalc) | 4.39 | 4.39 | 4.32 |
| Polymist F5A | 1.91 | 1.91 | 1.88 |
| Aerosil-200 | — | 1.31 | 1.29 |
| Ethylene Glycol | — | .15 | .15 |
| $Sb_2O_3$ (Fireshield AO-2) | .29 | .28 | .28 |
| Iragizan Blue | .02 | .02 | .02 |
| Phthalo Green | .49 | .49 | .48 |
| | 100.00 | 100.00 | 100.00 |

EXAMPLE 12

31.12 g of TMEIC, after heating at 100° C. for 15 minutes, was admixed with 18.75 of diallyl chlorendate and 0.11 g of benzopinacol. The mixture was heated with stirring at 90° for 1½ hours. To the above mixture was added the following materials:

| Materials | Grams |
|---|---|
| Capcure 3-800 | 19.9 |
| Diallylchlorendate | 56.25 |
| Isodecyl methacrylate | 3.0 |
| Stabilizer package | 0.33 |
| 2,2-dimethoxy-2-phenylacetophenone | 1.99 |
| Benzophenone | .85 |
| Dechlorane Plus | 25.0 |
| Hydrogel alumina filler | 5.0 |
| Aerosol 200 thixotropic agent | 2.5 |
| Ethylene glycol thixotropic agent | 0.25 |
| Nalco 2301 surfactant | 0.55 |
| Irgazin blue dye | 0.14 |

The above materials were mixed with the prepolymer at 60° for 1 hour and cooled to room temperature. The admixture was then screen printed through a 235 mesh screen onto a copper clad board and passed a rate of 10 ft. per minute under a Colight UV lamp to obtain a photocured solder mask. The thus cured mask was then submitted to a soldering treatment in a commercial wave soldering apparatus. A flux, i.e., "Alpha Flux 711-35", a rosin based isopropyl alcohol containing flux commercially available from Alphametals, Inc., Jersey City, NJ, was used to coat the areas to be soldered with flux. The board was then conveyed over a preheater which preheated the circuit board to a temperature of about 210° F. and then over a solder bath containing a 63/37 tin-led alloy maintained at 500° F. The board was then washed with 1,1,1-trichloroethane. Inspection of the board showed that the cured solder resist composition withstood the soldering environment and adhered well to the board.

The embodiments of the invention in which an exclusive property or privilege is claimed are therefore defined as follows.

We claim:

1. A photocurable, liquid-at-ambient temperature, hydrolysis resistant and fire-retardant composition consisting of
   (1) the reaction product of
      (a) an aliphatic unsaturation containing chlorendate, and
      (b) a non-ester containing polythiol, said (a) and (b) being reacted non-stoichiometrically;
   (2) a member of the group consisting of either (a) or (b) in an amount up to that sufficient to react with the excess of the other in (1) and a liquid acrylate monomer or oligomer, and
   (3) at least one photoinitiator.

2. The composition of claim 1 containing in addition a liquid acrylate monomer or oligomer.

3. The composition according to claim 1 where said non-ester containing polythiol is a member of the group consisting of a mercaptan-terminated polyoxyalkylene polyol of the formula:

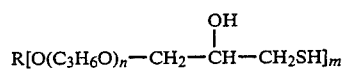

wherein
R is an aliphatic hydrocarbon moiety, n is 1–2 and m is 3–6 and a thiol substituted isocyanurate of the formula:

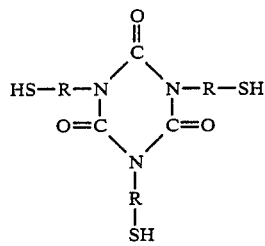

where R is —$CH_2CH_2$—.

4. The composition according to claim 1 wherein said aliphatic unsaturation containing chlorendate is a compound having the structure as follows:

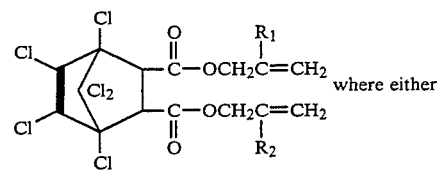

where either
(1) $R_1 = R_2 = H$ or
(2) $R_1 = H; R_2 = CH_3$ or

-continued (3) $R_1 = R_2 = CH_3$ i.e., (1) diallyl chlorendate (DAC), (2) allyl methallyl chlorendate (AMAC) and (3) dimethallyl chlorendate (DMAC) or mixtures thereof.

5. The composition according to claim 1 wherein said aliphatic unsaturation containing chlorendate is diallyl chlorendate (DAC) wherein said non-ester containing thiol is a mercaptan terminated polyoxyalkylene triol (MTPT), said liquid acrylate is ethoxylated bisphenol-A dimethacrylate (EOBADMA) and where the foregoing are so formulated as to be present in the following proportions in parts by weight:

DAC:MTPT:EOBADMA:10.0 to 4.0:1.6 to 0.8:1.4 to 0.0.

6. The composition according to claim 5 being so formulated as to additionally contain fire retardant additive fillers, adhesion promoter additive fillers, flow modifiers, thixotropic agents and dyes.

7. The composition according to claim 5 wherein said diallyl chlorendate is substituted by methallyl chlorendate, allyl-methallyl chlorendate or mixtures thereof.

8. The use of the composition of claim 1 as a coating for electronic circuit boards.

9. The composition according to claim 6 where said fire retardant filler is a halogenated aliphatic hydrocarbon.

10. The reaction product according to claim 1 wherein the reaction is promoted by a thermal initiator selected from the group of substituted or unsubstituted pinacols, preferably benzopinacol present in amounts ranging from 0.01–5%, preferably 0.1–3% by weight based on the weight of the chlorendate and the polythiol.

11. The coating composition according to claim 6 wherein said photoinitiator is 2,2-dimethoxy-2-phenylacetophenone and/or benzophenone present in amounts ranging from 0.0005 to 30% by weight of the allylically unsaturated compound and the thiol.

12. A process for forming a coating on a circuit board which comprises screen printing the composition of claim 1 in a desired pattern on said circuit board and, thereafter, exposing said coated composition to UV radiation for a time sufficient to obtain a thermoset coating.

13. A fire-retardant, hydrolysis resistant, flexible substrate consisting of a non-fire-retardant film coated with the composition of claim 1 and, subsequently, cured by UV light.

* * * * *